United States Patent [19]

Kuriyama et al.

[11] Patent Number: 5,669,304
[45] Date of Patent: Sep. 23, 1997

[54] STAMP UNIT AND METHOD OF PREPARING STAMP UNIT

[75] Inventors: Hiroshi Kuriyama; Youichi Kodaira; Haruyuki Miyasaka; Hideki Horiuochi, all of Suwa, Japan

[73] Assignee: Seiko Epson Corporation, Tokyo, Japan

[21] Appl. No.: 623,578

[22] Filed: Mar. 28, 1996

[30]        Foreign Application Priority Data

Mar. 30, 1995  [JP]  Japan .................. 7-099774
Feb. 22, 1996  [JP]  Japan .................. 8-035241

[51] Int. Cl.[6] ............................................. B41N 1/12
[52] U.S. Cl. ................. 101/401.1; 101/395; 430/300; 430/306
[58] Field of Search ............................... 101/333, 395, 101/401.1; 430/300, 306

[56]              References Cited

U.S. PATENT DOCUMENTS

| | | | |
|---|---|---|---|
| 3,615,450 | 10/1971 | Werber et al. | 101/401.1 |
| 4,020,138 | 4/1977 | Nettesheim et al. | 101/401.1 |
| 4,297,945 | 11/1981 | Sano et al. | 101/401.1 |
| 4,714,957 | 12/1987 | Takano | 358/93 |
| 4,934,267 | 6/1990 | Hashimoto et al. | 101/401.1 |
| 5,252,428 | 10/1993 | Kawamoto et al. | 101/401.1 |
| 5,275,919 | 1/1994 | Kawatsuji et al. | 101/401.1 |
| 5,443,938 | 8/1995 | Sakai | 430/162 |

FOREIGN PATENT DOCUMENTS 2-179783  of 1988  Japan .
6-278350  of 1993  Japan .

*Primary Examiner*—Eugene H. Eickholt
*Attorney, Agent, or Firm*—Harness, Dickey & Pierce, P.L.C.

[57]             ABSTRACT

A stamp unit and a method of preparing the same are provided in which a liquid photosensitive resin is used as the base material for stamp formation and the ease with which the material is handled during transportation, storage and stamp formation is facilitated. The stamp unit uses a liquid photosensitive resin which changes from liquid to solid upon receiving rays of light as the base material for stamp face formation. The stamp unit also includes a stamp stock, a liquid resin encapsulating section which is provided on the stamp face formation side of the stamp stock and which serves to encapsulate the liquid photosensitive resin in a state in which the resin can be exposed, an injection hole having one end open to the encapsulating space of the liquid resin encapsulating section and a second end open to the exterior, and a stopping member for stopping the injection hole to seal the liquid photosensitive resin in the liquid resin encapsulating section, wherein the liquid resin encapsulating section is constructed such that at least that portion thereof which covers the stamp face can be removed after stamp face formation.

30 Claims, 7 Drawing Sheets

STAMP UNIT AND METHOD OF PREPARING STAMP UNIT

BACKGROUND OF THE INVENTION

1. Technical Field

The present invention relates to a stamp unit and a stamp unit preparing method which provide easy forming of seals or stamps of a desired relief by partially curing a photosensitive liquid resin such as an ultraviolet-curing liquid resin.

2. Discussion

Previously, seal or stamp forming apparatus have been available on the market for enabling a person who is not an expert in forming stamps to form stamps, such as seals or rubber stamps (generally referred to as "stamps"). The stamp unit used in such apparatus consists of a stamp face forming member and a stamp stock supporting the stamp face forming member, each of the foregoing being prepared separately. The stamp face forming member is composed of a base member and an ultraviolet-curing resin portion, the ultraviolet-curing resin portion forming the stamp face. Under normal conditions, the ultraviolet curing resin has a fixed level of hardness and brittleness. When irradiated with ultraviolet rays, the resin increases in hardness and, at the same time, becomes tougher. Further, this ultraviolet-curing rein, which is water-soluble under normal conditions, becomes insoluble in water upon irradiation with ultraviolet rays.

When forming a stamp by using this stamp unit, a negative film with a desired stamp image is formed beforehand by using an exposure section of the apparatus. The ultraviolet-curing resin, which constitutes the stamp material, is then exposed to ultraviolet radiation through the negative film which is serving as a mask. As a result of this exposure, curing occurs in those portions of the ultraviolet-curing resin which correspond to the stamp image. The unit is then immersed in water and the uncured portion of the ultraviolet-curing resin is cleared away by scratching. Preferably, the ultraviolet-curing resin is again irradiated with ultraviolet rays to thereby stabilize the stamp face. Subsequently, the stamp face forming member is attached to a stamp stock to thereby complete a stamp.

According to the conventional stamp forming method above, the portion of the ultraviolet-curing resin not cured maintains a certain level of hardness and brittleness, requiring a great amount of time and bothersome operation to completely wash it away while softening it in water. Furthermore, an unskilled operator may cause damage to the cured resin portion by rubbing it too hard with a brush or the like. In addition, there is a fear that the rough surface of the stamp to which ink adheres when the stamp is used (i.e., the stamp surface portion which is made rough so as to not reject ink), will be smoothed away by excessive rubbing.

Although it may be possible to solve the above problems by using a photosensitive resin which is a liquid when in the uncured state, use of such a liquid photosensitive resin would make it necessary to take some measures for preventing the resin from flowing away in the uncured state. This would involve a rather difficult handling.

SUMMARY OF THE INVENTION

An object of the present invention is to provide a stamp unit and a method of preparing the same which, despite use of a liquid photosensitive resin as the material for stamp face formation, permits the material to be handled with ease in transportation, storage and stamp formation.

The present invention provides a stamp material which uses a liquid photosensitive resin as the base material for stamp face formation which changes from a liquid to a solid upon receiving rays of light. The stamp unit comprises a stamp stock, a liquid resin encapsulating section for sealing in the liquid photosensitive resin in a state in which it can be exposed, an injection hole having one end open to the encapsulating space of the liquid resin encapsulating section and a second end open to the exterior, and a stopping member for stopping the injection hole to seal the liquid photosensitive resin in the liquid resin encapsulating section, wherein the liquid resin encapsulating section is constructed such that at least that portion thereof which covers the stamp face can be removed after forming the stamp face.

In the above construction, the liquid photosensitive resin is injected from outside into the liquid resin encapsulating section through the injection hole, which is then stopped by the stopping member to thereby seal the liquid photosensitive resin in the liquid resin encapsulating section. When forming the stamp face, the liquid photosensitive resin is exposed in conformity with a predetermined relief pattern from outside through the liquid resin encapsulating section. After the stamp face has been formed through solidification (coagulation) of the liquid photosensitive resin, the portion of the liquid resin encapsulating section covering the stamp surface is removed. The portion of the liquid photosensitive resin which has not solidified is washed away, resulting in the solidified portion of the liquid photosensitive resin presenting a stamp face in the form of a relief or intaglio. In this way, use of an injection hole facilitates the sealing of the liquid photosensitive resin in the liquid photosensitive resin encapsulating section, and the provision of the liquid photosensitive resin encapsulating section on the stamp stock makes it possible for the liquid photosensitive resin to be treated together with the stamp stock. The term "stamp stock" generally represents the stock portion of a stamp, without indicating any particular material. Generally speaking, the stock may be formed of resin, metal, wood or the like.

It is desirable that at least that portion of the liquid resin encapsulating section which covers the stamp face be formed of a water-soluble material. In this construction, that portion of the liquid resin encapsulating section which covers the stamp face (which must be removed after exposure), can be easily washed away.

It is further desirable that at least that portion of the liquid resin encapsulating section which covers the stamp face be formed of a material which changes from a solid to a gel upon receiving rays of light. This construction allows that portion of the liquid resin encapsulating section which covers the stamp face (which must be removed after exposure), to be easily removed. In this case, it is desirable that the portion of the liquid resin encapsulating section which covers the stamp face be formed of a photosensitive material. It should be noted that the term "gel" as used herein is also applicable to a brittle substance which can be scraped off with a brush or the like.

It is also desirable that the liquid resin encapsulating section have a cover member which allows encapsulation of liquid photosensitive resin between the stamp and the stock. The cover member is preferably formed of a translucent material and arranged so as to be detachable from the stamp stock. Accordingly, exposure can be effected with the liquid photosensitive resin sealed in. Further, since the cover member is arranged so as to be detachable from the stamp stock, the cover member, which becomes unnecessary after exposure, can be easily removed.

It is yet further desirable that the cover member be equipped with a grip portion which enables it to be detached. This enables the cover member to be easily detached from the stamp stock. It is preferable that the grip portion be formed as a protrusion or a recess.

It is also desirable that the liquid resin encapsulating section have an encapsulation base member attached to the stamp stock and a cover-like member which allows encapsulation of liquid photosensitive resin therebetween. The cover-like member is preferably formed of a translucent material and arranged so as to be detachable from the encapsulation base member. In this construction, exposure can be effected through the cover-like member with the liquid photosensitive resin sealed in. Further, since the cover-like member is arranged so as to be detachable from the encapsulation base member attached to the stamp stock, the cover-like member, which becomes unnecessary after exposure, can be easily removed. Moreover, the liquid resin encapsulating section can be easily attached to the stamp stock by an adhesive or the like after the liquid photosensitive resin has been sealed in.

It is further desirable that the cover-like member be equipped with a grip portion which enables it to be detached. The cover-like member can then be easily detached from the encapsulation base member.

It is also desirable that the liquid resin encapsulating section have an encapsulation side-plate member attached to the stamp stock and an encapsulation front-plate member which covers the stamp face after its formation which allows encapsulation of liquid photosensitive resin between the encapsulation side-plate member and the stamp stock. The encapsulation front-plate member is preferably formed of a translucent material and arranged so as to be detachable from the encapsulation side-plate member. By forming the encapsulation front-plate member of a translucent material exposure can be effected with the liquid photosensitive resin sealed in. Further, since the encapsulation front-plate member is arranged so as to be detachable from the encapsulation side-plate member attached to the stamp stock, the encapsulation front-plate member, which becomes unnecessary after exposure, can be easily removed. Further, the encapsulation front-plate member can also be utilized as the frame of a framed stamp.

It is still yet further desirable that the encapsulation front-plate member be equipped with a grip portion which enables it to be detached. In this way, the encapsulation front-plate member can be easily detached from the encapsulation side-plate member.

It is further desirable to obtain the stopping member by solidifying the liquid photosensitive resin filling the injection hole through exposure. In this construction, the liquid photosensitive resin filling the injection hole is solidified through exposure, thereby stopping the injection hole and sealing the liquid photosensitive resin injected within the liquid resin encapsulating section. In this way, the injection hole is stopped without using any tap or the like thereby simplifying the stopping structure. It is preferable, from the viewpoint of simplification of the stopping structure, that the liquid photosensitive resin injected into the liquid resin encapsulating section is the same as the resin filling the injection hole. However, it is also possible that these liquid photosensitive resins have different properties.

It is yet further desirable that the liquid photosensitive resin be one which changes from a gel to a solid by exposure. By this construction, the injection hole is stopped as in the case when handling a jelly or clay if a resin in the form of a gel is adopted for the liquid photosensitive resin to fill the injection hole, i.e., the liquid photosensitive resin serving as the stopping member. In this case, the liquid photosensitive resin in the liquid resin encapsulating section is prevented from leaking out when the liquid photosensitive resin is exposed.

It is desirable for the injection hole to have a bent section at a position between the ends thereof. Accordingly, the light applied from the outside of the open end of the injection hole exposes the liquid photosensitive resin in the injection hole but is blocked (reflected) by the bent section. Therefore, the light does not affect the liquid photosensitive resin sealed in the liquid resin encapsulating section.

It is still further desirable for the injection hole to have a light blocking member at a position between the ends thereof.

Therefore, instead of or in addition to the above-mentioned bent section, there is provided a light blocking member at a position between the ends thereof so that the injection hole can be appropriately stopped through exposure without affecting the liquid photosensitive resin sealed in the liquid resin encapsulating section.

It is also desirable for the blocking member to be arranged so as to be attachable between the ends of the injection hole so as to be capable of stopping the injection hole. In this construction, the injection path can be stopped by the blocking member serving as a tap after the injection of the liquid photosensitive resin into the liquid resin encapsulating section. Thus, the liquid photosensitive resin filling the injection hole can be completely separated from that sealed in the liquid resin encapsulating section. Further, the liquid photosensitive resin sealed in the liquid resin encapsulating section is prevented from being affected by the exposure of the liquid photosensitive resin filling the injection hole.

It is also desirable for the outer opening of the injection hole to be formed in the stamp block. Thus, it is possible for the outer opening of the injection hole to be spaced away from the liquid resin encapsulating section. From a structural point of view, this construction is advantageous in that the liquid photosensitive resin sealed in the liquid resin encapsulating section is affected as little as possible by the exposure of the liquid photosensitive resin filling the injection hole. Further, this construction facilitates the exposure. Moreover, since the injection hole can be made long, an increase in the degree of freedom can be achieved with respect to the injection hole stopping structure and, further, the injection hole can be reliably stopped.

It is further desirable for the outer opening of the injection hole to be formed in the cover member. By this construction, the stopping member is not conspicuous, so that the design of the completed stamp is simplified in terms of outward appearance. Further, the injection hole can be formed with ease. It is desirable for the outer opening to be provided on a side of the cover member.

It is still further desirable for the outer opening of the injection hole to be formed in the cover-like member. As in the above-described embodiment, the stopping member is inconspicuous, so that the design of the completed stamp is simplified in terms of outward appearance. Further, the injection hole can be formed with ease. It is desirable for the outer opening to be provided on a side of the cover-like member.

It is still yet further desirable for the outer opening of the injection hole to be formed in the encapsulation side-plate member. As in the above-described embodiment, the stopping member is inconspicuous, so that the design of the completed stamp is simplified in terms of outward appearance. Further, the injection hole can be formed with ease.

It is also desirable that a plurality of independent injection holes be provided. In this embodiment, one injection hole can be used for the injection of the liquid photosensitive resin, and another can be used for releasing air (ventilation), so that the requisite time for injecting the liquid photosensitive resin is shortened. Further, the injection of the liquid photosensitive resin can be executed easily and reliably without having to use a vacuum injection method or the like.

It is still also desirable to provide a main injection hole, which is on the outer opening side, and a plurality of branch injection holes branching off from the main injection hole and situated on the inner opening side. According to this construction, the requisite time for injecting the liquid photosensitive resin is shortened. Further, this construction is relatively free from air accumulation or the like, making it possible for the liquid photosensitive resin to be injected easily and reliably.

The base material for stamp face formation preferably uses a liquid photosensitive resin which changes from liquid to solid upon receiving light, and comprises a stamp stock and a liquid resin encapsulating section provided on the stamp face formation side of the stamp stock which seals in the liquid photosensitive resin where it can be exposed. The liquid resin encapsulating section comprises an encapsulation front-plate member which covers the stamp face after its formation formed of a translucent material, and an encapsulation side-plate member for sealing in the liquid photosensitive resin between the encapsulation front-plate member and the stamp stock. The encapsulation front-plate member is formed so as to be capable of being removed after the stamp face formation, and the encapsulation side-plate member is formed by solidifying a liquid photosensitive resin through irradiation with light.

In the above construction, the encapsulation side-plate member is formed by solidifying (coagulating) a liquid photosensitive resin through irradiation with light so that the step of forming the liquid resin encapsulating section and the step of injecting liquid photosensitive resin into it can be executed essentially at the same time. Thus, this arrangement makes it possible to omit the injection hole thereby simplifying the structure of that portion of the stamp unit where the liquid resin is encapsulated. Further, it is possible for the encapsulation front-plate member to simply consist of a flat, translucent plate which leads to an increase in degree of freedom with respect to material selection. From this viewpoint also, it is possible to simplify the structure of that portion of the stamp unit where the liquid resin is encapsulated.

It is also desirable for the encapsulation front-plate member to be formed of a water-soluble material. Accordingly, the uncured portion of the liquid photosensitive resin can be easily removed together with the encapsulation front-plate member after exposure solely by washing in water without having to detach the encapsulation front-plate member.

It is further desirable for the encapsulation front-plate member to be formed of a material which changes from a solid to a gel upon receiving light. By this construction, the exposure process for stamp face formation also serves as the exposure to facilitate the removal of the encapsulation front-plate member. In this case, it is desirable for the encapsulation front-plate member to be formed of a photosensitive resin. The term "gel" in this case also applies to a brittle substance which can be scraped off with a brush or the like.

The stamp unit preparing method preferably includes a liquid photosensitive resin which changes from liquid to solid when it receives light, as the base material for stamp face formation. According to the method, a cover member, which covers the stamp face and is formed of a translucent material, and a stamp stock which is arranged adjacent to the cover member through the intermediation of a gap, are immersed in the liquid photosensitive resin and the periphery of the gap between the cover member and the stamp stock is solidified through irradiation with light to thereby seal liquid photosensitive resin in this gap portion.

Thus, the container portion for sealing in the liquid photosensitive resin can be easily prepared, and the injection of the liquid photosensitive resin can be executed essentially simultaneously with the preparation of the container portion. When effecting the irradiation with light, a lens is used to focus the light on the resin portion to be solidified with the focus being appropriately shifted.

It is also desirable for the cover member to be formed of a water-soluble material. In this way, the cover member can be easily removed, for example, by washing in water.

It is further desirable for the cover member to be formed of a material which changes from a solid to a gel when it receives light. In this embodiment, the exposure process for stamp face formation also serves as the exposure process to facilitate the removal of the cover member. In this case, it is desirable for the cover member to be formed of a photosensitive resin. The term "gel" in this case also applies to a brittle substance which can be scraped off with a brush or the like.

According to a method for forming a stamp face, a liquid photosensitive resin which changes from liquid to solid upon receiving light is used as the base material. A cover member, which covers the stamp face formed of translucent material is immersed in the liquid photosensitive resin, and a portion corresponding to the stamp stock is solidified through exposure. Further, the periphery of the gap between the cover member and the stamp stock is solidified through irradiation with light to thereby seal liquid photosensitive resin in this gap portion.

In accordance with this method, not only the container portion for encapsulating the liquid photosensitive resin but also the stamp stock can be integrally formed. Further, the injection of the liquid photosensitive resin can be conducted essentially simultaneously with the formation.

DETAILED DESCRIPTION OF THE INVENTION

Figure 1:
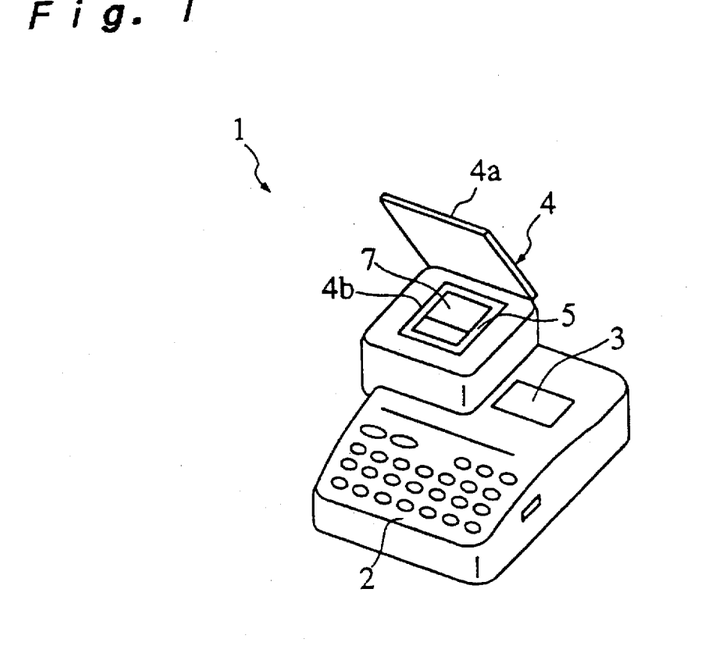
FIG. 1 is a perspective view of a stamp forming apparatus for forming a stamp through use of a stamp forming unit according to the present invention.
Figure 2:
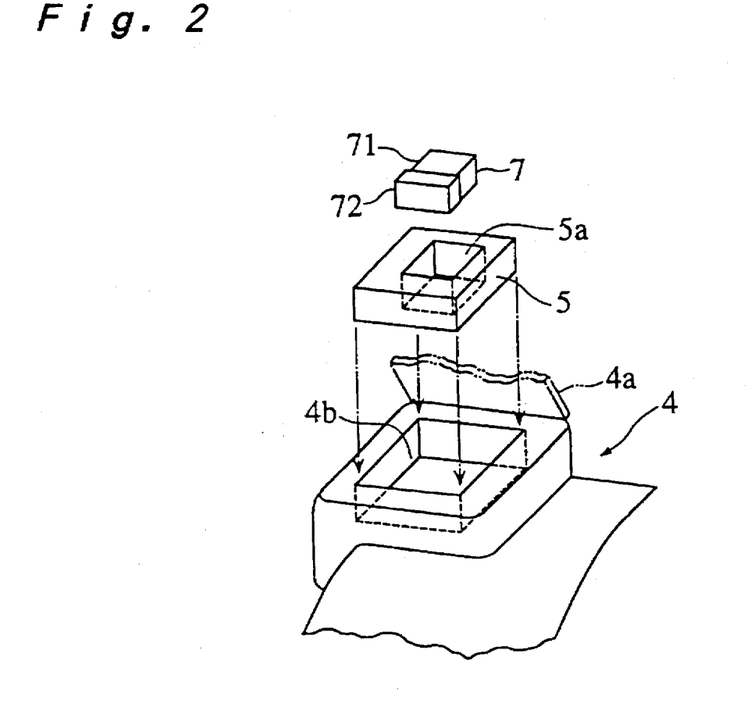
FIG. 2 is a partially exploded view showing how a cartridge and the stamp forming unit are mounted on a ribbon cartridge attachment section as is shown in FIG. 1.

Preferred embodiments of the present invention will now be described with reference to the drawings. FIGS. 1 and 2 show the outward appearance of a stamp forming apparatus to which the present invention is applicable. As shown in these drawings, this stamp forming apparatus, generally indicated by numeral 1, includes a key input section 2 for inputting desired characters, a display section 3 for displaying the input characters, and a ribbon cartridge attachment section 4. The ribbon cartridge attachment section 4 is equipped with a lid 4a. By opening lid 4a, a rectangular attachment recess 4b formed within is exposed and a rectangular ribbon cartridge 5 can be attached to this attachment recess 4b.

As shown in FIG. 2, a rectangular pocket 5a is formed at the center of the ribbon cartridge 5. A stamp forming unit 7, which comprises the stamp unit, is attached to this pocket 5a. The inner space of the ribbon cartridge 5 which is around the pocket 5a contains an ink ribbon and a print paper ribbon, which will be described below.

The construction of the ribbon cartridge attachment section 4 and that of the ribbon cartridge 5 will now be described with reference to FIG. 3. The ribbon cartridge 5 includes a cartridge case 51 having a fixed thickness. The cartridge case 51 includes a dispensing reel 53 for dispensing an ink ribbon 52, a take-up reel 58 for taking up the ink ribbon 52 and a printing paper reel 55 for dispensing a printing ribbon 54. The ink ribbon 52 is dispensed from the dispensing reel 53 and is guided by a guide 56 to a printing position 57 and is further guided along an inner peripheral wall 51b of the case from an exposure position 60 and is taken up by the take-up reel 58. The driving shaft of the take-up reel 58 is provided on the attachment recess 4b of the cartridge attachment section 4. By attaching the ribbon cartridge 5 to this attachment recess 4b, the take-up reel 58 is fitted onto the driving shaft 58.

The printing paper ribbon 54 is dispensed from the printing paper reel 55 and led to the printing position 57 where it is held in contact with the ink ribbon 52 and further led to the exterior through an outlet 51a formed in a side wall of the cartridge case 51. Another outlet 4c, which is positioned in an extension of the outlet 51a, is formed on the main body of the apparatus and permits the printing paper ribbon to be delivered to the exterior through this outlet 4c. In the vicinity of the outlet 4c is arranged a manually operated cutter 4d. By pushing down a cutter button 4e, which is arranged adjacent to the cutter 4d, a cutting operation is executed. Thus, the portion of the printing paper ribbon 54 which has been delivered to the exterior of the apparatus can be cut to a predetermined length by the cutter 4d.

At the printing position 57 mentioned above are provided a thermal transfer type printing head 57a and a platen roller 57b facing it. The printing head 57a is provided on the attachment recess 4b of the cartridge attachment section 4 and protrudes through the wall of the rectangular cartridge case 51 of the ribbon cartridge 5 into the interior of the case 51. The roller portion of the platen roller 57b is mounted on the cartridge 5, whereas the driving shaft thereof is attached to the attachment recess 4b. Due to this construction, the printing head 57a faces the platen roller 57b with a small space left therebetween. At the same time, the platen roller 57b is fitted onto the driving shaft thereof and is thereby rotatable.

The exposure position 60 mentioned above is a portion extending along one side of the inner peripheral wall 51b of the cartridge case 51. A pair of guides 61 and 62 are arranged respectively at either end of this side of the inner peripheral wall. Further, an ultraviolet irradiation source 63, which serves as the exposure means, is provided on the main body of the apparatus in such a way as to extend opposite and parallel to the portion of the ink ribbon 53 which extends between the pair of guides 61 and 62. Between the ink ribbon 53 and the ultraviolet irradiation source 63, a ribbon presser plate 65, which allows transmission of ultraviolet rays, is arranged so as to be parallel to the ink ribbon 53.

This ribbon presser plate 65 is provided, for example, on the attachment recess 4b of the stamp forming apparatus 1. As shown in FIG. 3, when the cartridge 5 is attached, the ribbon presser plate 65 is situated to the ultraviolet irradiation source 63 side with respect to the pair of guides 61 and 62. This ribbon presser plate 65 can be caused to move toward the guides 61 and 62 by a mechanism (not shown) to thereby press the portion of the ink ribbon 53 extending between the guides 61 and 62 against the stamp forming unit 7. Here, the pair of guides 61 and 62 can be displaced toward the stamp forming unit 7 by a spring or the like (not shown), and move similar to the ribbon presser plate 65.

Thus, during the exposure process, the negative portion of the ink ribbon 53 is pressed against a transparent cover 72 of the stamp forming unit 7 (described below) by the ribbon presser plate 65. In this way, there is no fear of the irradiation being allowed to reach a part where it is not needed. Instead of an ultraviolet-transmissive plate, it is also possible for the ribbon presser plate 65 to comprise a rectangular frame with its central portion corresponding to the negative portion of the ink ribbon 53 forming a rectangular opening.

Figure 3:
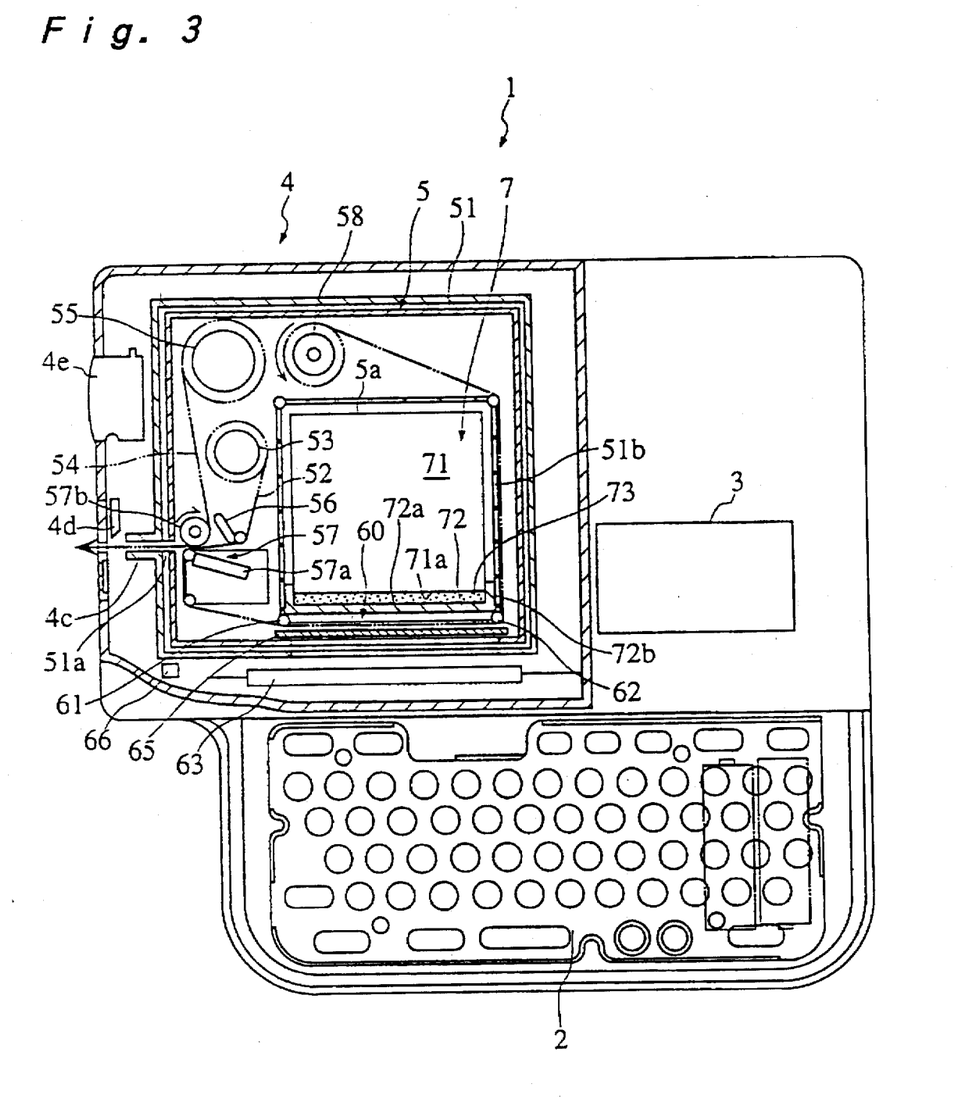
FIG. 3 is an enlarged plan view showing the construction of the cartridge attachment section and a ribbon cartridge attached thereto.

Further, as shown in FIG. 3, the cartridge attachment section 4 is equipped with a lid-opening detecting switch 66 for detecting the opening and closing of the lid 4a thereof. This lid-opening detecting switch 66, which communicates with the opening and closing of the lid 4a, automatically turns off the ultraviolet irradiation source 63 when the lid 4a is opened. Thus, if the lid 4b is inadvertently opened during ultraviolet exposure, the ultraviolet irradiation source 63 is turned off automatically. Therefore, there is no fear of ultraviolet rays being leaked to the exterior.

Figure 4A:
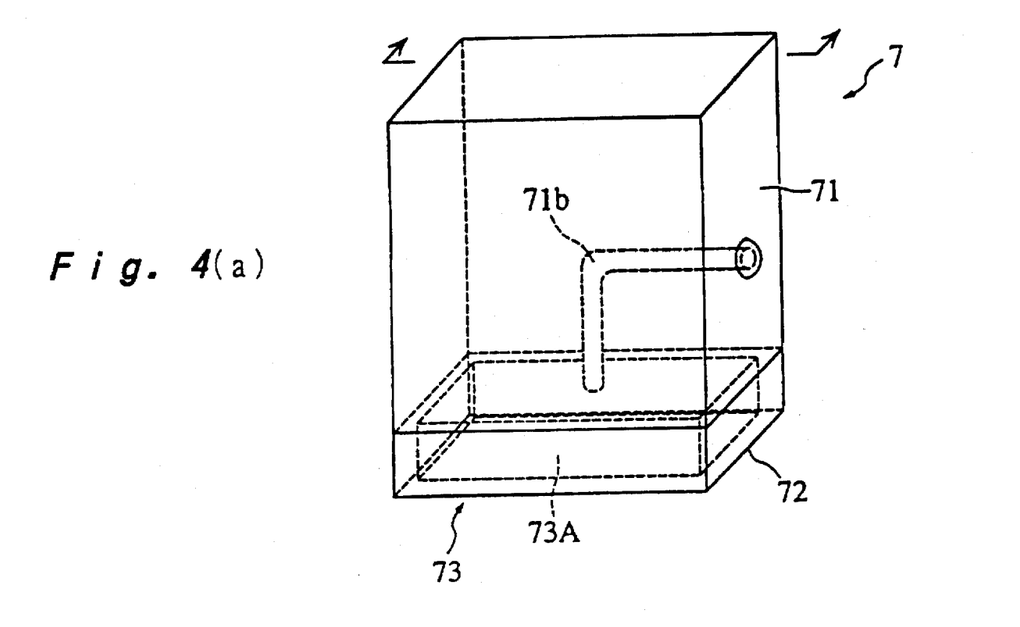
FIGS. 4(a) and 4(b) are diagrams showing the construction of a stamp forming unit according to the present invention.
Figure 4B:
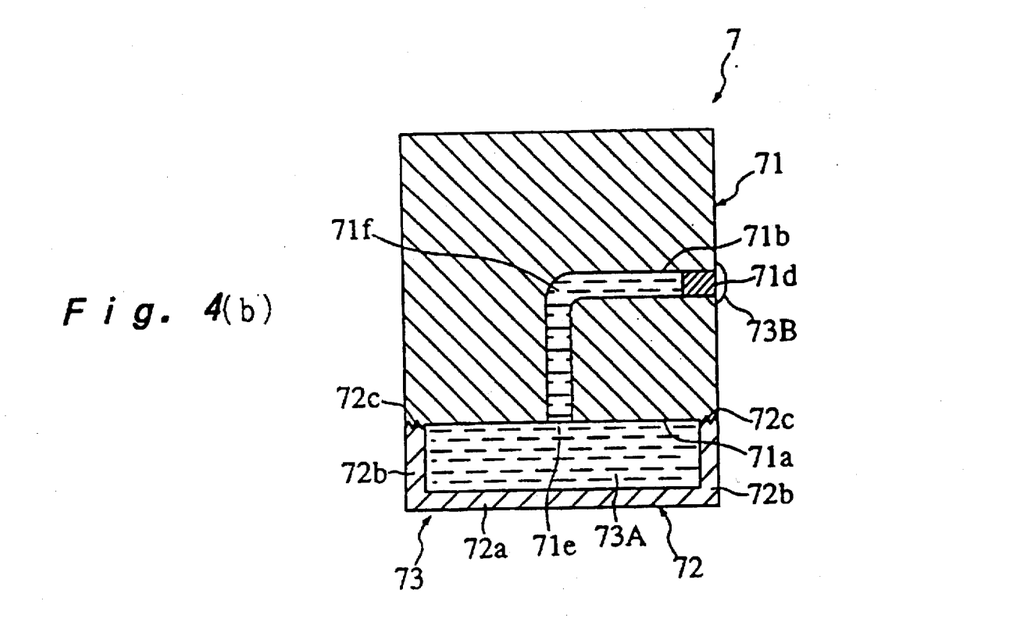

Next, the stamp forming unit 7, which is attachable to the opening 5a formed in the cartridge 5, will be described with reference to FIGS. 4(a) and 4(b).

Preferably the stamp forming unit 7 has a generally rectangular configuration and is equipped with a stock (stamp stock) 71. Further, it has a transparent cover (a cover member) 72 attached to an end surface 71a of the stock 71 so as to be liquid-tight and detachable. A liquid resin encapsulating section 73 comprises a space defined between the transparent cover 72 and the end surface 71a of the stock 71. The liquid resin encapsulating section 73 is filled with a photosensitive liquid resin 73A. The stock 71 and the transparent cover 72 preferably comprise articles formed by resin molding. The photosensitive liquid resin 73A comprises an ultraviolet-curing type liquid resin, which changes from a liquid to a solid (i.e., solidifies) upon receiving ultraviolet rays. The transparent cover 72 allows transmission of ultraviolet rays and is equipped with a flat bottom wall 72a and four side walls 72b formed therearound. The end surfaces 72c of the side walls 72b are formed so as to be liquid-tight with respect to the end surface 71a of the stock and are detachably secured to the stock.

Within the stamp stock 71, an injection hole 71b for the liquid resin 73A is formed in a manner such that the injection hole 71b is bent substantially at a right angle. One end of the injection hole 71b communicates with an outer opening 71d arranged substantially at the center of a side surface of the stock 71. The injection hole 71b communicates with the exterior through the opening 71d. The other end of the injection hole 71b communicates with an inner opening 71e positioned substantially at the center of the end surface 71a of the stock 71 and the end surface 71a is covered with the transparent cover 72. The injection hole 71b communicates with the interior of the liquid resin encapsulating section 73 through the opening 71e.

The outer opening 71d is stopped by a stopping member 73B formed of cured resin. The stopping member 73B is obtained by curing a resin through exposure which is preferably the same kind as the ultraviolet curing type liquid resin 73A sealed in the liquid resin encapsulating section 73.

Further, surface treatment or surface shaping is performed on the end surface 71a of the stock 71 such that the adhesion of the cured resin to the end surface 71a of the stock 71 is greater than the adhesion of the cured resin to the transparent cover 72. More specifically, those surfaces of the transparent cover 72 which face the encapsulating space 73 are finished smooth, whereas the end surface 71a of the stock is finished rough, so that when the transparent cover 72 is removed from the stock 71 after the curing of the liquid resin 73A, the cured resin remains on the stock 71.

In the stamp forming unit 7 constructed as described above, the liquid resin 73A is injected into the interior of the liquid resin encapsulating section 73 as follows. First, the transparent cover 72 is attached to the end surface 71a of the stock 71 so as to cover the latter. As a result, the liquid resin encapsulating section 73 is defined therebetween. As described above, the liquid resin encapsulating section 73 communicates with the exterior through the injection hole 71b. Next, the liquid resin 73A is injected through the outer opening 71d by, for example, a vacuum injection method. When the liquid resin encapsulating section 73 has been filled with liquid resin 73A, the injection hole 71b is also filled with liquid resin 73A.

Subsequently, the nozzle for injecting the liquid resin is removed from the outer opening 71d and only that portion of the liquid resin 73A which fills the injection hole 71b is cured by exposure to rays from outside. In this exposure process, the portion of the liquid resin filling the liquid resin encapsulating section 73 is not exposed. Thus, that portion of the liquid resin 73A in the injection hole 71b near the outer opening 71d is cured and thereby converted into a stopping member 73B for stopping the injection hole 71b. Thus, the liquid resin 73A is sealed in the liquid resin encapsulating section 73.

Since the outer opening 71d is formed at the center of a side wall of the stock 71 so that it is sufficiently spaced apart from the liquid resin encapsulating section 73, the curing through exposure of that portion of the liquid resin 73A which is near this outer opening does not affect that portion of the liquid resin 73A which is in the liquid resin encapsulating section 73. Further, since the injection hole 71b includes a bent section 71f, the ultraviolet rays applied from outside are obstructed so that the curing of the liquid resin 73A in the injection hole 71b only occurs in that portion of the injection hole which is on the outer opening 71d side.

Next, the procedures for forming a stamp by using the stamp forming apparatus 1 of this embodiment, constructed as described above, will be described with reference to FIGS. 1 through 3.

First, the operator opens the lid 4a of the cartridge attachment section 4 and secures the ribbon cartridge 5 within the attachment recess 4b. Further, the stamp forming unit 7 is secured within the opening 5a of the ribbon cartridge 5 and the lid 4a is closed.

Next, desired characters to be shaped in the form of a relief (a stamp image) are input through the key input section 2. The group of characters thus input are displayed on the display section 3, whereby it is possible to check whether the desired characters have been input or not. After the desired characters have been input, a printing operation is designated through the key input section 2. This causes a ribbon feeding drive mechanism and a printing control mechanism, which are contained in the main body of the apparatus, to operate to start the feeding of the ink ribbon 52 and of the printing paper ribbon 53 and, at the same time, drive the heat generating elements of the printing head 57a to thereby perform printing operation on the ink ribbon 52 and the printing paper ribbon 54, which pass the printing position 57.

As a result, the relief characters are printed on the printing paper ribbon 54 passing the printing position 57, and those portions of the ink ribbon 52 corresponding to the relief characters are transferred to the printing paper ribbon 54. That is, the relief characters are printed on the printing paper ribbon 54, and a negative film, whose portions corresponding to the characters allow transmission of ultraviolet rays, are formed on the ink ribbon 52. After this, the printing paper ribbon 54 is discharged to the exterior of the apparatus through the outlets 51a and 4c and cut to a predetermined length by the cutter 4d. The ink ribbon 52 is further fed, until it stops when the portion thereof with the negative film has reached the exposure position 60.

When the portion of the ink ribbon 52 with the negative film has reached the exposure position 60, the ribbon presser plate 65 first moves to a position parallel to it, and then brings the portion of the ink ribbon 52 with the negative film, (which extends between the pair of guides 61 and 62), into close contact with the surface of the transparent cover 72 of the stamp forming unit 7. Next, the ultraviolet radiation source 63 is activated and, using the portion of the ink ribbon 52 with the negative film as a mask, exposure is effected for a fixed period of time on the liquid photosensitive resin 73A sealed in the liquid resin encapsulating section 73 of the stamp forming unit 7. As a result, the exposed portions of the liquid resin 73A are cured and turned from liquid to solid. The unexposed portion of the resin remain in a liquid state. In this way, the cured portions of the liquid resin 73A, which correspond to the characters in the shape of a relief, form a stamp face. After the exposure, the ribbon presser plate 65 retreats to its original position and, consequently, the pair of guides 61 and 62 return to their respective original positions.

After this, the lid 4a is opened and the stamp forming unit 7 is taken out of the attachment recess 4b. Next, the transparent cover 72 is removed from the stamp forming unit 7. Due to the adhesion of the cured resin to the transparent cover 72 being much lower than that to the end surface 71a of the stock 71, so that the cured resin remains stuck to the stock 71. Thus, the transparent cover 72 is alone easily detached. When the transparent cover 72 has been detached, the uncured portion of the liquid resin 73A begins to flow of itself, leaving the cured portions behind. To completely remove the uncured portion of the resin, a liquid such as water is used for washing it away.

Thus, only the cured portions of the liquid resin 73A remain to provide a surface in the shape of a relief (a stamp face) corresponding to the relief characters. In this way, it is possible to obtain from the stamp forming unit 7 a stamp unit (or a stamp) having a relief stamp face with desired relief characters. To indicate the relief characters of the stamp unit, the portion of the printing paper ribbon 54 with the above-mentioned relief characters is secured to the back surface of the stock 71.

In the above embodiment, the liquid photosensitive resin 73A is sealed in the stamp forming unit 7 so that after exposure the uncured resin portion flows away by removing the transparent cover 72, leaving the cured relief stamp portions (the cured resin) only. If some remaining portion of the uncured resin 73A has to be wiped off with blotting paper or the like, the process can be executed more easily and in a shorter time as compared with the case in which solid ultraviolet curing resin is to be scraped off.

It should be noted that the liquid resin 73A used may be one which cures by rays of light with a wavelength other than that of ultraviolet rays. It is also possible for the transparent cover 72 itself to be formed of a water-soluble material or one which is turned into a substance that can be scraped off, such as a gel. For example, assuming that the transparent cover 72 is formed of a resin mixed with a surface active agent, such as a water-soluble nylon resin, the transparent cover 72 can be melted and removed by washing in water after exposing the liquid resin 73A in the liquid resin encapsulating section 73, and, at the same time, the uncured portion of the liquid resin 73A can be washed away.

Regarding the sealing structure for the liquid resin 73A, it is desirable that the end portion of the transparent cover 72 and the joint surface of the stock 71 be closely connected together by using a sealing material or the like. However, it is also possible to adopt some other sealing structure. For example, an adhesive tape may be wound around the joint section between the transparent cover 72 and the stock 71 for the purpose of effecting sealing in this section. This is advantageous in that the end portion of the transparent cover 72 and the stock 71 can be easily joined together and sealed solely by winding an adhesive tape around the joint section, and that the transparent cover 72 can be easily detached from the stock solely by peeling off the adhesive tape.

Further, in this embodiment a material with a low refractive index offering satisfactory transmissivity with respect to ultraviolet rays is used for the transparent cover 72 filling liquid photosensitive resin 73, so that it is possible to obtain a high-quality relief stamp face free from any deformation (foot expansion, tapering, etc.) in the protruding sections.

Thus, by adopting the construction of the stamp forming unit 7 described above, it is possible to easily inject the liquid resin 73A into the liquid resin encapsulating section 73 by using the injection hole 71b. Further, after the injection of the liquid resin 73A, exposure can be effected on the portion of the liquid resin 73A in the injection hole 71b to cause it to cure, so that the liquid resin 73A can be easily sealed in the liquid resin encapsulating section 73.

The liquid resin filling the injection hole 71b may be the same as the one injected into the liquid resin encapsulating section 73 or one different from it. For example, if the liquid photosensitive resin filling the injection hole 71b is one having high viscosity, such as a gel, it can serve as a tap for the injection hole 71b, so that leakage of the liquid resin can be prevented even before the curing, thereby facilitating the handling.

Figure 5A:
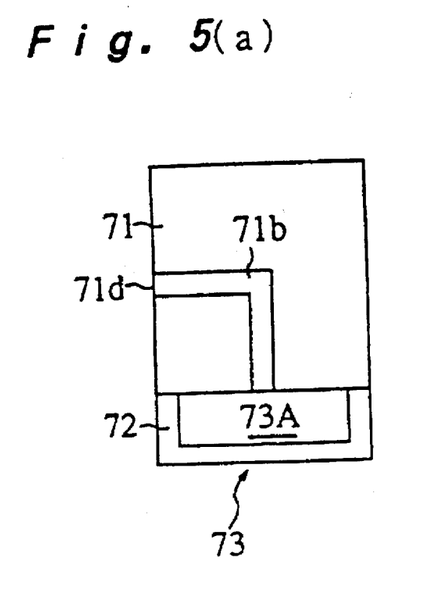
FIGS. 5(a) through 5(d) are diagrammatic views showing various embodiments of the stamp forming unit of the present invention including different patterns of the injection hole.
Figure 5B:
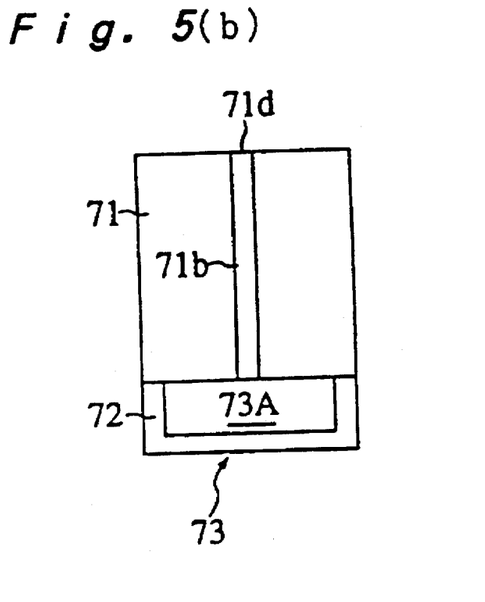
Figure 5C:
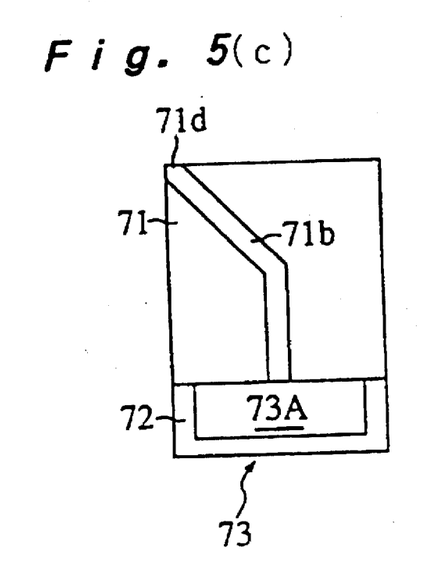

Next, modifications of the stamp forming unit 7 will be described with reference to FIG. 5(a) through 5(d). While in the stamp forming unit 7 of the above-described embodiment the outer opening 71d for injecting the liquid resin 73A from outside is formed in a side wall of the stock 71, this outer opening 71d may be formed in some other place in the stock 71. For example, as shown in FIGS. 5(a), 5(b) and 5(c), it can be formed in another side wall, or in a corner or in an end surface on the opposite side of the end surface on the injection side.

Figure 5D:
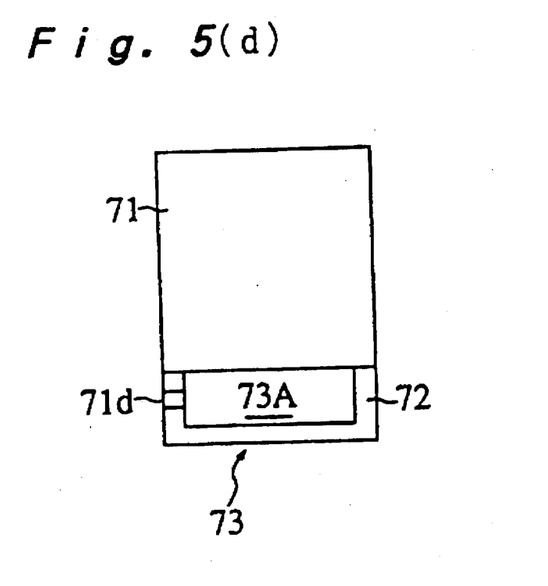

Alternatively, as shown in FIG. 5(d), the injection hole 71b and the outer opening 71d thereof can be formed in the transparent cover 72. In this case, the conditions for the exposure for stopping the injection hole 71b, etc. are set appropriately so that adverse effects on the liquid resin 73A filling the liquid resin encapsulating section 73 may be restrained.

Figures 6A, 6B:
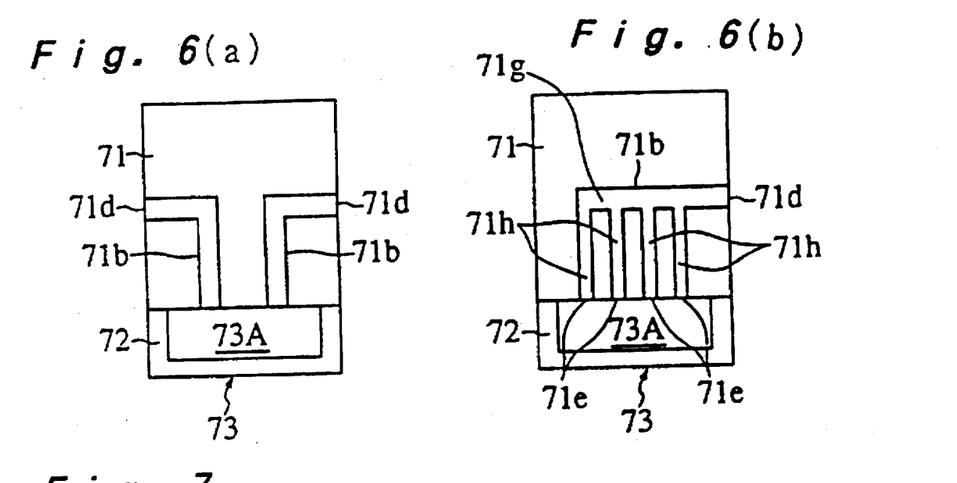
FIGS. 6(a) and 6(b) are diagrammatic views showing other embodiments of the stamp forming unit of the present invention, including a plurality of injection holes.

While in the above examples only one injection hole 71b is formed in the stock 71, it is also possible to form two or more injection holes 71b. FIG. 6(a) shows an example in which two independent injection holes 71b are formed. The two injection holes 71b are arranged symmetrically with respect to the center line of the stock 71, with their respective outer openings 71d being formed in opposite side surfaces. In comparison with the case in which only one injection hole is formed, this construction is advantageous in, for example, that the injecting operation can be conducted in a shorter time. Further, if there are two or more injection holes 71b, one of them can serve as the injection side and the remaining one can serve as the air releasing side, so that there is no need to adopt the vacuum injection method or the like.

Further, as shown in FIG. 6(b), it is also possible for the injection hole 71b to consist of a main injection hole 71g on the outer opening 71d side and a plurality of branch injection holes 71b branching off from the main injection hole 71g and having their respective inner openings 71e. This construction is advantageous in, for example, that the adhesion between the portion of the liquid resin 73A filling the liquid resin encapsulating section and the stock 71 can be enhanced by the portion of the liquid resin 73A filling the branch injection holes 71h.

Further, as described above, the injection hole 71b may be linear or L-shaped or even curved.

Figure 7:
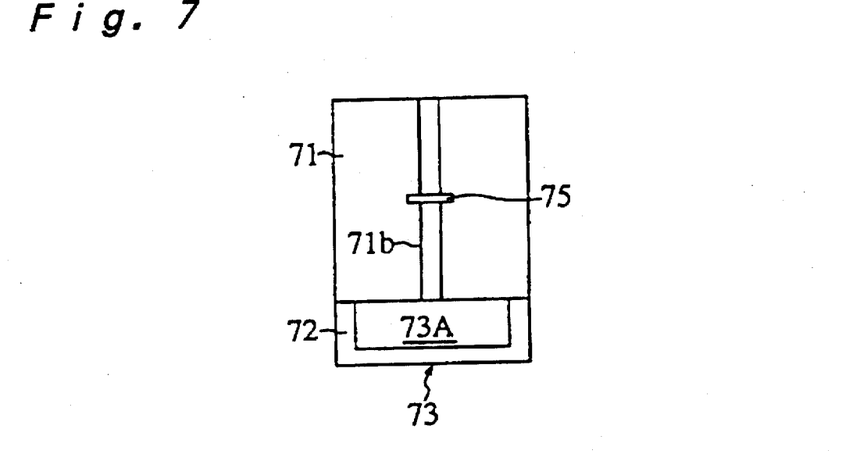
FIG. 7 is a diagram showing still another embodiment of the stamp forming unit of the present invention including a tap provided in the injection hole.

Regarding the stopping structure for the injection hole 71b, formed inside the stock 71, it is possible, for example, as shown in FIG. 7, to stop the injection hole by putting, by press-fitting or the like, a tap 75, which is a separate member, at a position between both ends of the injection hole. In this case, the tap 75 is attached after filling the liquid resin encapsulating section 73 with liquid resin 73A. After this, the portion of the liquid resin 73A filling that section of the injection hole near the outer opening 71d is exposed to rays from outside to thereby form a stopping member 73B. In this way, the tap 75 is arranged between the outer and inner ends of the injection hole 71b, whereby rays of light are blocked by this section and the curing of the resin in the portion near the outer opening 71d is perfectly limited to this tap. Thus, the liquid resin 73A in the liquid resin encapsulating section 73 is not adversely affected by this exposure. Further, the provision of this tap 75 makes it possible to reduce the length of the injection hole 71b, and gives a higher degree of freedom in determining the position of the outer opening 71d.

Figure 8:
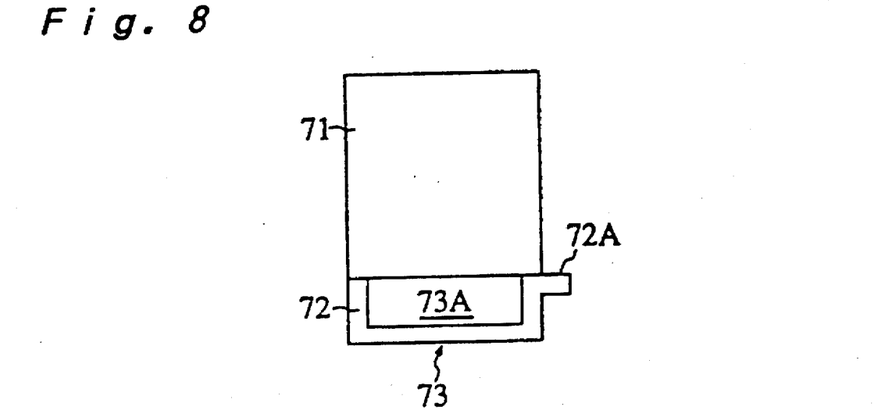
FIG. 8 is a diagrammatic view showing a further embodiment of the stamp forming unit of the present invention including an ear formed on a transparent cover.

When a water-soluble material is used for the transparent cover 72 as in the above-described case, the transparent cover 72 is separated from the stamp stock 71 in the final process by hand or by machine. To facilitate this separating operation, it is desirable to form, for example, an ear 72A protruding from a side surface of the transparent cover 72 as shown in FIG. 8. The provision of this ear 72A enables the transparent cover 72 to be easily detached from the stock, for example, with one finger. Instead of the ear 72A, a recess may be formed on a side surface of the transparent cover 72, which recess will serve as a grip.

Figure 9:
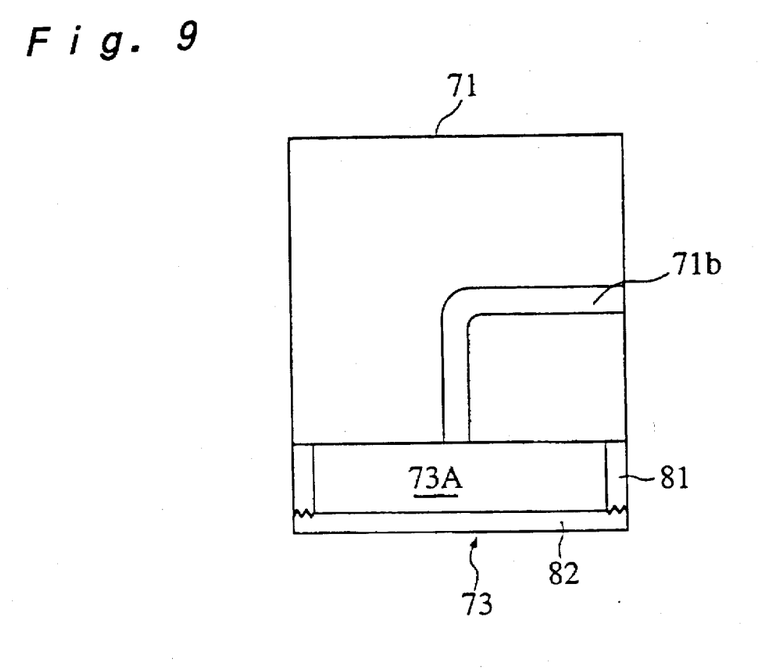
FIG. 9 is a diagrammatic view showing the construction of a second embodiment of a stamp forming unit according to the present invention.

Next, a stamp forming unit according to a second embodiment of the present invention will be described with reference to FIG. 9. In the stamp forming unit 7 of this embodiment, a section corresponding to the above-described transparent cover 72 is composed of two members: an encapsulation side-plate member 81 and an encapsulation front-plate member 82. In this case, one end of the encapsulation side-plate member 81 is secured to the stock 71, and the other end thereof is detachably attached to the encapsulation front-plate member 82. After the stamp face has been formed by curing the liquid resin sealed in the liquid resin encapsulating section 73, only the encapsulation front-plate member 82 is detached. Thus, the outer end section of the encapsulation side-plate member 81, which remains on the stock, can be utilized as the frame in a framed stamp.

Figure 10:
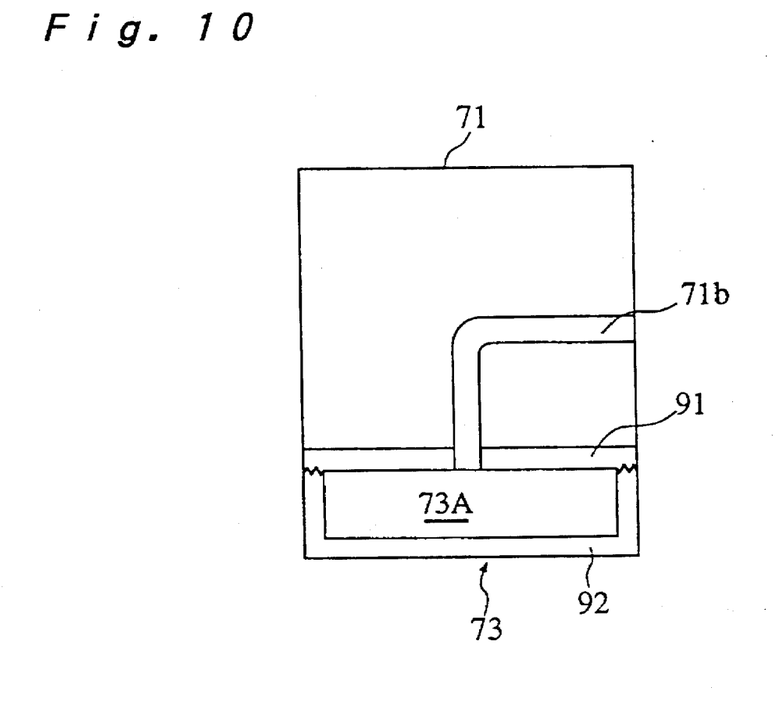
FIG. 10 is a diagrammatic view showing the construction of a third embodiment of a stamp forming unit according to the present invention.

Next, a stamp forming unit according to a third embodiment of the present invention will be described with reference to FIG. 10. In the stamp forming unit 7 of this embodiment, the liquid resin encapsulating section 73 is composed of an encapsulation base member 91 and a cover-like member 92 detachably attached to it. The encapsulation base member 91 of the liquid resin encapsulating section 73 is secured to the stock 71, and the liquid resin encapsulating section 73 can be filled with liquid resin 73A independently.

Forming the liquid resin encapsulating section 73 and the stock 71 as separate members contributes to an improvement in terms of the ease with which the liquid resin 73A can be handled. Although the example shown in the drawing has an injection hole 71b extending through the stock 71 and through the encapsulation base member 91, this injection hole 71b can be omitted when the filling of the liquid resin encapsulating section 73 with liquid resin 73A is performed prior to the attachment of the liquid resin encapsulating section 73 to the stock 71.

Figure 11:
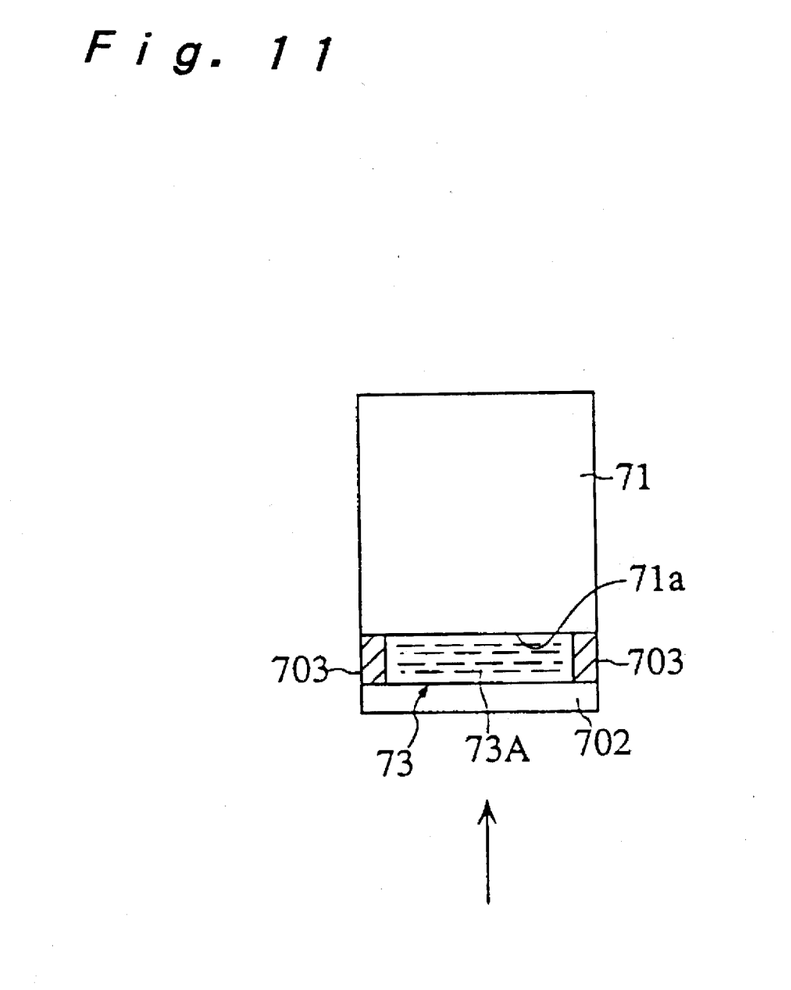
FIG. 11 is a diagrammatic view showing the construction of a fourth embodiment of a stamp forming unit according to the present invention.

Next, a stamp forming unit according to a fourth embodiment of the present invention will be described with reference to FIG. 11, which shows another structure for defining the liquid resin encapsulating section 73. In the example shown, a transparent flat cover plate 702 is arranged at a fixed distance from the end surface 71a of the stock 71 so as to extend parallel to the end surface. The space or gap between them is enclosed by enclosure side walls 703, which are formed by curing a peripheral portion of the liquid resin 73A. In this way, the liquid resin encapsulating section 73 is defined by the end surface 71a of the stock, the transparent flat cover plate 702, and the enclosure side walls 703.

This liquid resin encapsulating section 73 is formed, for example, as follows: first, the transparent flat cover plate 702 is placed at the bottom of a container, and then liquid resin 73A is poured over it. After that, the stamp stock is set in position, and then a frame-shaped negative film is arranged such that ultraviolet rays are applied exclusively to that portion of the liquid resin corresponding to the enclosure side walls 703, which can be formed by applying ultraviolet rays for exposure curing from the direction as indicated by an arrow in the drawing. Alternatively, weak ultraviolet rays may be applied through a lens so as to form the enclosure side walls 703 by scanning with the focus. When the liquid resin encapsulating section 73 is formed in the construction according to this embodiment, the enclosure side walls 703 will remain on the stock after the removal of the transparent flat cover plate 702. That is, the construction provides a framed relief stamp face.

This construction allows use of a flat transparent member as the cover. Such a plate is more simple in comparison with the transparent cover 72 as used in the above-described embodiments, which has to be formed by injection molding. This simplicity in configuration provides a higher light transmissivity, and makes it advantageously possible to use a material with low refractive index for the member 702, thus providing an optimum cover member.

Further, in the above method, not only the enclosure side walls 703 but also the stock 71 can be formed through the curing of the liquid resin 73A.

Thus, a liquid photosensitive resin can be easily injected from outside into a liquid resin encapsulating section through an injection hole and, at the same time, the liquid photosensitive resin can be treated in a state in which it is appropriately sealed in. Thus, no such problem as leakage of the liquid photosensitive resin is involved during the injection, transportation, storage, or forming into a stamp of the liquid photosensitive resin, thereby achieving an improvement in terms of the ease with which it is handled.

Also, in another embodiment, the steps of forming the liquid resin encapsulating section and that of filling the liquid resin encapsulating section with liquid photosensitive resin can be conducted simultaneously. Thus, the preparation of the stamp unit is facilitated.

Further, the preparation of the stamp unit, in which liquid photosensitive resin is sealed, is further facilitated.

What is claimed is:

1. A stamp unit including a base material for stamp face formation using a liquid photosensitive resin which changes from a liquid to a solid upon receiving rays of light, said stamp unit comprising:

a stamp stock;

a liquid resin encapsulating section provided on a stamp face formation side of the stamp stock serving to encapsulate the liquid photosensitive resin in an exposable state;

an injection hole having one end open to the liquid resin encapsulating section and another end open to the exterior; and a stopping member for stopping the injection hole to thereby seal the liquid photosensitive resin in said liquid resin encapsulating section;

wherein said liquid resin encapsulating section is constructed such that at least that portion thereof which covers the stamp face can be removed after the stamp face formation.

2. The stamp unit as claimed in claim 1, wherein at least that portion of the liquid resin encapsulating section which covers the stamp face is formed of a water-soluble material.

3. The stamp unit as claimed in claim 1, wherein at least that portion of the liquid resin encapsulating section which covers the stamp face is formed of a material which changes from a solid to a gel upon receiving rays of light.

4. The stamp unit as claimed in claim 1, wherein the liquid resin encapsulating section includes a cover member encapsulating said liquid photosensitive resin between the cover and the stamp stock;

the cover member being formed of a translucent material and arranged so as to be detachable from the stamp stock.

5. The stamp unit as claimed in claim 4, wherein the cover member includes a grip portion facilitating detachment.

6. The stamp unit as claimed in claim 1, wherein the liquid resin encapsulating section includes an encapsulation base member attached to the stamp stock and a cover-like member encapsulating the liquid photosensitive resin between itself and the encapsulation base member;

the cover-like member being formed of a translucent material and arranged so as to be detachable from the encapsulation base member.

7. The stamp unit as claimed in claim 6, wherein said cover-like member includes a grip portion facilitating detachment.

8. The stamp unit as claimed in claim 1, wherein the liquid resin encapsulating section includes an encapsulation side-plate member attached to the stamp stock and an encapsulation front-plate member covering the stamp face and allowing encapsulation of the liquid photosensitive resin between the encapsulation side-plate member and the stamp stock;

the encapsulation front-plate member being formed of a translucent material and arranged so as to be detachable from the encapsulation side-plate member.

9. The stamp unit as claimed in claim 8, wherein the encapsulation front-plate member is equipped with a grip portion facilitating detachment.

10. The stamp unit as claimed in claim 1, wherein the stopping member is formed by solidifying the liquid photosensitive resin filling the injection hole through exposure.

11. The stamp unit as claimed in claim 10, wherein the liquid photosensitive resin is transformable from a gel to a solid by exposure.

12. The stamp unit as claimed in claim 10, wherein the injection hole has a bent section at a position between the one and the another end thereof with respect to the direction in which it extends.

13. The stamp unit as claimed in claim 10, wherein the injection hole includes a light blocking member for blocking rays of light from exposure at a position between the one and the another end thereof with respect to the direction in which it extends.

14. The stamp unit as claimed in claim 13, wherein the blocking member can be attached to a section between the one and the another end of the injection hole with respect to the direction in which it extends, and is capable of stopping the injection hole.

15. The stamp unit as claimed in claim 1, wherein an outer opening of the injection hole is formed in the stamp stock.

16. The stamp unit as claimed in claim 4, wherein an outer opening of the injection hole is formed in the cover member.

17. The stamp unit as claimed in claim 6, wherein an outer opening of the injection hole is formed in the cover-like member.

18. The stamp unit as claimed in claim 8, wherein an outer opening of the injection hole is formed in the encapsulation side-plate member.

19. The stamp unit as claimed in claim 1, wherein the injection hole consists of a plurality of individual injection holes.

20. The stamp unit as claimed in claim 1, wherein the injection hole comprises a main injection hole provided on the outer opening and a plurality of branch injection holes branching off from the injection hole and situated on an inner opening side thereof.

21. A stamp unit including a base material for stamp face formation using a liquid photosensitive resin which changes from a liquid to a solid upon receiving rays of light, said stamp unit comprising:

a stamp stock;

a liquid resin encapsulating section provided on a stamp face formation side of the stamp stock serving to encapsulate the liquid photosensitive resin in an exposable state;

the liquid resin encapsulating section including an encapsulation front-plate member covering the stamp face formed of a translucent material, and an encapsulation side-plate member for encapsulating the liquid photosensitive resin between the encapsulation front-plate member and the stamp stock;

the encapsulation front-plate member being formed so as to be capable of being removed after the stamp face formation; and the encapsulation side-plate member being formed by solidifying the liquid photosensitive resin through irradiation with light.

22. The stamp unit as claimed in claim 21, wherein the encapsulation front-plate member is formed of a water-soluble material.

23. The stamp unit as claimed in claim 21, wherein the encapsulation front-plate member is formed of a material which changes from a solid to a gel upon receiving light.

24. A method of preparing a stamp unit including a base material for stamp face formation employing a liquid photosensitive resin which changes from liquid to solid upon receiving light, the method comprising the steps of:

immersing a cover member, covering a stamp face and formed of a translucent material, and a stamp stock, arranged adjacent to the cover member through the intermediation of a gap, in the liquid photosensitive resin; and solidifying the periphery of the gap between the cover member and the stamp stock through irradiation with light to thereby seal the liquid photosensitive resin in the gap portion.

25. The method of claim 24, wherein the cover member is formed of a water-soluble material.

26. The method of claim 24, wherein the cover member is formed of a material which changes from a solid to a gel upon receiving light.

27. A method of preparing a stamp unit including a base material for stamp face formation, employing a liquid photosensitive resin which changes from a liquid to a solid upon receiving light, the method comprising the steps of:

immersing a cover member which covers a stamp face and which is formed of a translucent material in the liquid photosensitive resin; and solidifying a portion of the resin corresponding to a stamp stock through exposure and, further, solidifying a periphery of a gap between the cover member and the stamp stock through irradiation with light to thereby seal the liquid photosensitive resin in the gap portion.

28. A stamp unit comprising:

a stamp stock;

a base material for forming a stamp face comprising a liquid photosensitive resin transformable from a liquid state to a solid state by irradiation;

a resin encapsulating section comprising a translucent, detachable cover member having a grip portion, said cover member being secured to an encapsulating side plate member, said encapsulating side plate member being secured to said stamp face, said encapsulating section being secured to said stamp stock in a manner such that said liquid photosensitive resin is exposable to radiation, said cover member being water soluble and transformable from a solid state to a gel state by irradiation;

at least one injection channel having a first end open to said encapsulating section and a second end open to the exterior of said stamp unit; and a stopping member sealingly engageable with said injection channel.

29. The stamp unit of claim 28 wherein said stopping member comprises a portion of said photosensitive resin in said injection channel in said solid state.

30. The stamp unit of claim 28 wherein said at least one injection channel further comprises a plurality of secondary channels, each of said secondary channels having a first end open to said encapsulating section and a second end open to said at least one injection channel.

* * * * *